United States Patent
Adelmann et al.

(10) Patent No.: US 9,685,322 B2
(45) Date of Patent: Jun. 20, 2017

(54) LAYER DEPOSITION ON III-V SEMICONDUCTORS

(71) Applicant: IMEC VZW, Leuven (BE)

(72) Inventors: Christoph Adelmann, Wilsele (BE); Silvia Armini, Leuven (BE)

(73) Assignee: IMEC VZW, Leuven (BE)

( * ) Notice: Subject to any disclaimer, the term of this patent is extended or adjusted under 35 U.S.C. 154(b) by 300 days.

(21) Appl. No.: 14/488,857

(22) Filed: Sep. 17, 2014

(65) Prior Publication Data
US 2015/0091142 A1    Apr. 2, 2015

(30) Foreign Application Priority Data

Sep. 27, 2013 (EP) .................................. 13186263

(51) Int. Cl.
*H01L 21/469* (2006.01)
*H01L 21/02* (2006.01)
*H01L 29/06* (2006.01)

(52) U.S. Cl.
CPC .... *H01L 21/02318* (2013.01); *H01L 21/0226* (2013.01); *H01L 21/02046* (2013.01);
(Continued)

(58) Field of Classification Search
CPC ......... H01L 21/02107; H01L 21/02112; H01L 21/02299; H01L 21/02304;
(Continued)

(56) References Cited

U.S. PATENT DOCUMENTS 5,616,947 A * 4/1997 Tamura ............. H01L 21/28264
257/289
5,970,381 A * 10/1999 Ohno ..................... B05D 1/185
438/622

(Continued)

OTHER PUBLICATIONS

O'Connor, E. et al., "Analysis of the Minority Carrier Response of n-Type and p-Type Au/Ni/Al2O3/In0.53Ga0.47As/InP Capacitors Following an Optimized (NH4)2S Treatment", Applied Physics Letters, No. 99, 2011, pp. 212901-1-212901-3.
(Continued)

*Primary Examiner* — Trung Q Dang
(74) *Attorney, Agent, or Firm* — McDonnell Boehnen Hulbert & Berghoff LLP

(57) ABSTRACT

The present disclosure relates to a method (100) for depositing a layer on a III-V semiconductor substrate, in which this method comprises providing (102) a passivated III-V semiconductor substrate comprising a III-V semiconductor surface which has a surface passivation layer provided thereon for preventing oxidation of said III-V semiconductor surface. The surface passivation layer comprises a self-assembled monolayer material obtainable by the reaction on the surface of an organic compound of formula R-A, wherein A is selected from SH, SeH, TeH and $SiX_3$. X is selected from H, Cl, O—$CH_3$, O—$C_2H_5$, and O—$C_3H_2$, and R is a hydrocarbyl, fluorocarbyl or hydrofluorocarbyl comprising from 5 to 20 carbon atoms. The method further comprises thermally annealing (107) the III-V semiconductor substrate in a non-oxidizing environment such as to decompose the self-assembled monolayer material, and depositing (108) a layer on the III-V semiconductor surface in the non-oxidizing environment.

13 Claims, 8 Drawing Sheets

(52) U.S. Cl.
CPC .. *H01L 21/02052* (2013.01); *H01L 21/02107* (2013.01); *H01L 21/02112* (2013.01); *H01L 21/02118* (2013.01); *H01L 21/02299* (2013.01); *H01L 21/02304* (2013.01); *H01L 29/06* (2013.01)

(58) Field of Classification Search
CPC .......... H01L 21/02188; H01L 21/0226; H01L 21/02046; H01L 29/06; H01L 21/02118
USPC ........................................................ 438/779
See application file for complete search history.

(56) References Cited

U.S. PATENT DOCUMENTS

| | | | |
|---|---|---|---|
| 7,745,272 | B2 | 6/2010 | Van de Walle et al. |
| 7,989,280 | B2* | 8/2011 | Brask ................ H01L 21/28008 257/189 |
| 2002/0045289 | A1 | 4/2002 | Dimitrakopoulos et al. |
| 2002/0182385 | A1* | 12/2002 | Senkevich ............. B82Y 30/00 428/209 |
| 2006/0108320 | A1* | 5/2006 | Lazovsky ............. B82Y 30/00 216/2 |
| 2010/0173494 | A1 | 7/2010 | Kobrin |
| 2011/0031481 | A1* | 2/2011 | Von Wrochem ...... H01L 51/002 257/40 |
| 2011/0168669 | A1 | 7/2011 | Cho et al. |
| 2011/0177236 | A1 | 7/2011 | Lazovsky et al. |
| 2011/0198736 | A1* | 8/2011 | Shero .................... B82Y 30/00 257/629 |
| 2013/0043508 | A1* | 2/2013 | Merckling ........ H01L 21/28264 257/201 |
| 2013/0078819 | A1 | 3/2013 | Sun et al. |

OTHER PUBLICATIONS

European Search Report, European Patent Application No. 13186263.3, dated Apr. 11, 2014.
Tamanuki, Takemasa et al., "Interface Recombination Reduction by (NH4)2Sx-Passivation in Metalorganic Chemical Vapor Deposition Regrown GaAlAs/GaAs Buried Heterostructure Lasers and Estimation of Threshold Currents in Microcavity Surface Emitting Lasers", Japanese Journal of Applied Physics, vol. 31, No. 10, Oct. 1992, pp. 3292-3294.
Fischer, V. et al., "Formation of OHMIC Contacts to nGaAs Using (NH4)2S Surface Passivation", Journal of Vacuum Science & Technology, vol. 12, No. 3, May/Jun. 1994, pp. 1419-1421.
Huang, T.P. et al., "Adsorption and Thermal Reaction of Short-Chain Alkanethiols on GaAs (1 0 0)", Surface Science, vol. 603, Mar. 2009, pp. 1244-1252.
Remashan, K. et al., "Effects of Octa Decyl Thiol (ODT) Treatment on the Gallium Arsenide Surface and Interface State Density", Thin Solid Films, vol. 342, 1999, pp. 20-29.
Salihoglu, Omer et al., "A Comparative Passivation Study for the InAs/GaSb Pin Superlattice Photodetectors", IEEE Journal of Quantum Electronics, vol. 49, No. 8, Aug. 2013, pp. 661-666.
Kim, Sungwook et al., "Self-Assembled Monolayer Cleaning Methods: Towards Fabrication of Clean High-Temperature Superconductor Nanostructures", Applied Physics Letters, vol. 86, 2005, pp. 154104-1-154104-3.
Tan, C.S. et al., "Cu-Cu Diffusion Bonding Enhancement at Low Temperature by Surface Passivation Using Self-Assembled Monolayer of Alkane-Thiol", Applied Physics Letters, vol. 95, 2009, pp. 192108-1-192108-3.

* cited by examiner

LAYER DEPOSITION ON III-V SEMICONDUCTORS

CROSS REFERENCE TO RELATED APPLICATIONS

This application claims priority to EP 13186263.3, filed Sep. 27, 2013, which is incorporated by reference in its entirety.

FIELD OF THE DISCLOSURE

The disclosure relates to the field of semiconductor devices. More specifically it relates to a method for depositing a layer onto a III-V semiconductor substrate, to the use of such a method for the manufacture of a III-V semiconductor device, to the use of intermediary structures obtained during such a method for the manufacture of such a III-V semiconductor device, and to III-V semiconductor devices obtained from such a method.

BACKGROUND OF THE DISCLOSURE

III-V semiconductors, such as GaAs, InAs, AlAs, InP, or alloys thereof, are materials of interest for metal-oxide semiconductor (MOS) applications as potential replacement of silicon (Si). However, III-V surfaces are prone to oxidization when exposed to air. The native oxides which form on the surface due to this oxidation are of poor quality, e.g. lead to a high density of interface defects and are poor insulators. Such interface defects are known in the art to be detrimental to the performance of semiconductor devices manufactured in or on the III-V semiconductor material.

There is therefore a need in the art for new methods for obtaining III-V semiconductor components having a low density of interface defects between the III-V substrate and an overlaying layer.

Passivation with $(NH_4)_2S$ solutions has been used for this purpose by E. O'Connor et al. (Appl. Phys. Lett. 99, 212901 (2011)). In this paper, a $(NH_4)_2S$ passivation layer was formed on the surface of a InGaAs substrate after a cleaning step. This may remove the native oxide, and improve the air stability of the III-V surface, thereby reducing re-oxidation after the cleaning step while the sample is exposed to air, prior to gate oxide deposition or another layer deposition step.

However, such a method does not allow for the passivated III-V substrate to be maintained for an extended time period in air. The transfer to the ALD reactor needed to be performed within 3 minutes. Also, there remains a need for more stable passivation solutions, e.g. providing more stable surfaces in air, and more thorough passivation.

SUMMARY OF THE DISCLOSURE

It is an object of embodiments of the present disclosure to provide a method permitting to obtain a good interface between a III-V semiconductor substrate and a layer, e.g. a dielectric layer, deposited thereon.

It is an advantage of embodiments of the present disclosure that a good contact can be achieved between a layer deposited on a III-V semiconductor substrate and the semiconductor material, e.g. without interface impurities relating to uncontrolled oxidation of the III-V semiconductor material, e.g. oxidation by exposure to ambient atmospheric conditions, such as exposure to air at 290 K and 1 kPa.

It is an advantage of embodiments of the present disclosure that the method permits exposure to air for at least one hour of a passivated intermediate structure of the method without causing oxidation of said passivated intermediate structure. This permits an easy handling between passivation of the substrate and the layer deposition. The passivated III-V semiconductor substrate can be exposed to air without any decline of the surface properties, e.g. during transport or storage in air. For instance, the exposure to air can be at least one hour, without substantial oxidation. In some embodiments if vacuum-packed, the passivated III-V semiconductor substrate can be stable for over a week.

It is an advantage of embodiments of the present disclosure that passivation and a surface cleaning may be performed efficiently in one single step.

It is an advantage of embodiments of the present disclosure that a high capacitance may be achieved in a field effect transistor or photoelectric element on a III-V semiconductor substrate.

The above objective is accomplished by a method and device according to the present disclosure.

In a first aspect, the present disclosure relates to a method for depositing a layer on a III-V semiconductor substrate. This method comprises providing a passivated III-V semiconductor substrate comprising a III-V semiconductor surface which has a surface passivation layer provided thereon for preventing oxidation of the III-V semiconductor surface. The surface passivation layer comprises a self-assembled monolayer material obtainable by the reaction on the III-V semiconductor surface of an organic compound of formula R-A, wherein A is selected from SH, SeH, TeH and $SiX_3$, in which X is selected from H, Cl, O—$CH_3$, O—$C_2H_5$, and O—$C_3H_7$, and in which R is a hydrocarbyl, fluorocarbyl or hydrofluorocarbyl comprising from 5 to 20 carbon atoms.

The method further comprises thermally annealing the passivated III-V semiconductor substrate in a non-oxidizing environment such as to decompose said self-assembled monolayer material, and depositing a layer on the III-V semiconductor surface in the non-oxidizing environment.

In a method according to embodiments of the present disclosure, providing the passivated III-V semiconductor substrate may comprise providing a passivated III-V semiconductor substrate in which the self-assembled monolayer material is obtainable by the reaction on the surface of an organic compound of formula R—SH, R—SeH, or R—TeH. This has the advantage of providing a good reactivity of the organic compound on an oxide-free substrate surface. Preferably, the organic compound has the formula R—SH as it is less toxic than R—SeH or R—TeH.

In a method according to embodiments of the present disclosure, depositing the layer on the passivated III-V semiconductor substrate may comprise performing an atomic layer deposition step. This permits the deposition of a very thin (e.g. atomic) and conformal layer. The deposition of a low defect atomic layer is facilitated by the high quality of the interface obtainable with embodiments of the present disclosure.

In a method according to embodiments of the present disclosure, depositing the layer may comprise depositing a dielectric material layer comprising a material having a static relative permittivity $\kappa$ higher than silicon-dioxide, e.g. a static relative permittivity $\kappa$ of at least 4.0. Examples of suitable high-k materials are $Al_2O_3$, $HfO_2$, $ZrO_2$, and $Ln_2O_3$ amongst others.

In a method according to embodiments of the present disclosure, thermally annealing the passivated III-V semiconductor substrate may comprise exposing the passivated III-V semiconductor substrate to a temperature of 470 K or higher. This has the advantage of breaking the bond between the atom A and the chain R in the formula R-A, thereby removing the chains R which have bad dielectric properties.

In a method according to embodiments of the present disclosure, thermally annealing the passivated III-V semiconductor substrate may comprise exposing the passivated III-V semiconductor substrate to water, e.g. to water vapour. This is advantageous as it permits an improved removal of the chains R of the self-assembled monolayer and it permits a particularly clean oxide-free surface, ideal for further layer deposition.

In a method according to embodiments of the present disclosure, providing the passivated III-V semiconductor substrate may comprise obtaining the III-V semiconductor substrate, removing oxides eventually present on the III-V semiconductor surface and forming the surface passivation layer on the III-V semiconductor surface.

In a method according to embodiments of the present disclosure, forming the surface passivation layer may comprise exposing the III-V semiconductor substrate to a fluid comprising an organic compound of formula R-A, wherein A is selected from SH, SeH, TeH and $SiX_3$, wherein X is selected from H, Cl, O—$CH_3$, O—$C_2H_5$ and O—$C_3H_7$, and wherein R is a hydrocarbyl, fluorocarbyl or hydrofluorocarbyl comprising from 5 to 20 carbon atoms.

In a method according to embodiments of the present disclosure, removing of the oxide may comprise performing a wet cleaning process step simultaneously with the step of forming the self-assembled monolayer on the III-V semiconductor surface. This permits to perform two steps in one and it prevent accidental re-oxidation between oxide removal and SAM formation.

In a method according to embodiments of the present disclosure, removing the oxide may comprise performing a dry cleaning process step simultaneously with the step of forming the self-assembled monolayer on the III-V semiconductor surface.

It is an advantage of at least these two last embodiments of the present disclosure that oxides may be removed and a self-assembled monolayer may be formed on the III-V semiconductor in a single efficient process step. It also prevents accidental re-oxidation between oxide removal and SAM formation.

In a method according to embodiments of the present disclosure, providing the passivated III-V semiconductor substrate may comprise providing a passivated III-V semiconductor substrate, wherein the substrate comprises GaAs, InAs, AlAs, InP and/or InGaAs semiconductor material.

In a method according to embodiments of the present disclosure, providing the passivated III-V semiconductor substrate may comprise providing a planar passivated III-V semiconductor substrate.

In a second aspect, the present disclosure relates to the use of the method for the manufacture of a field effect transistor or a photovoltaic cell.

In a third aspect, the present disclosure relates to a III-V semiconductor component comprising a III-V semiconductor substrate having a dielectric material layer deposited thereon, in which an interface region between the III-V semiconductor substrate and the dielectric material is substantially free of oxides of the III-V semiconductor substrate and comprises residual sulfur, selenium, tellurium, and/or silicon atoms.

In a fourth aspect, the present disclosure relates to the use of a surface passivation layer provided on a III-V semiconductor surface as a sacrificial layer for preventing oxidation of an intermediate product in the manufacturing process of a III-V semiconductor component, the surface passivation layer comprising a self-assembled monolayer material obtainable by the reaction on the III-V semiconductor surface of an organic compound of formula R-A, wherein A is selected from SH, SeH, TeH and Si $X_3$, wherein X is selected from H, Cl, O—$CH_3$, O—$C_2H_5$, and O—$C_3H_7$, and wherein R is a hydrocarbyl, fluorocarbyl or hydrofluorocarbyl comprising from 5 to 20 carbon atoms, Particular and preferred aspects of the disclosure are set out in the accompanying independent and dependent claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described hereinafter.

Figure 1:
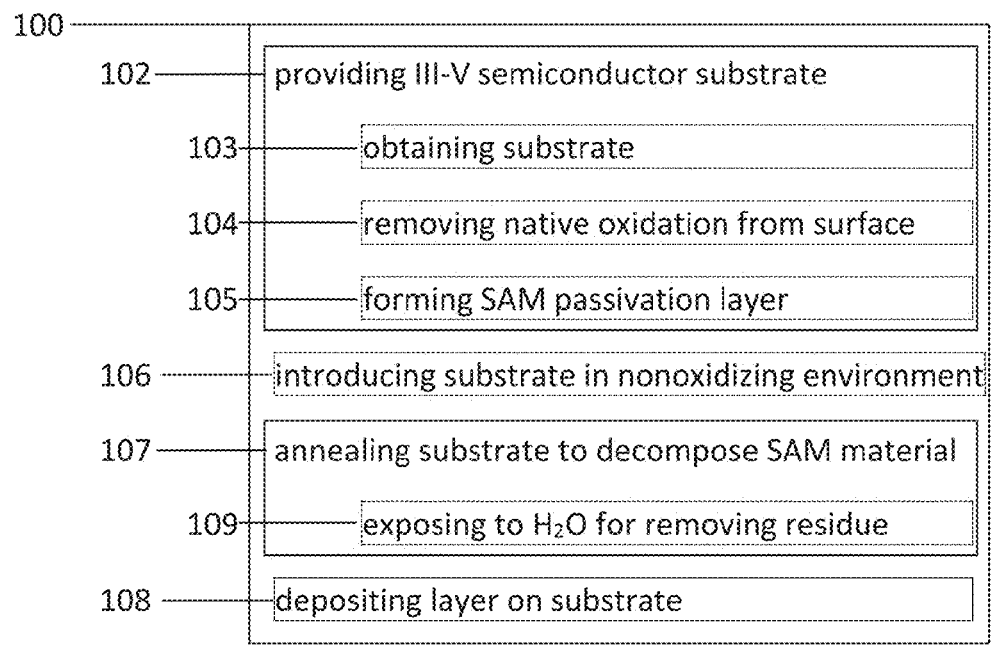
FIG. 1 illustrates an exemplary method according to embodiments of the present disclosure.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth.

However, it is understood that embodiments of the disclosure may be practiced without these specific details. In other instances, well-known methods, structures and techniques have not been shown in detail in order not to obscure an understanding of this description.

Where in embodiments of the present disclosure reference is made to a "III-V compound", reference is made to a chemical compound with at least one group III (IUPAC group 13) element and at least one group V element (IUPAC group 15). This includes binary compounds but also higher order compounds such as ternary compounds.

In a first aspect, the present disclosure relates to a method for depositing a layer on a III-V semiconductor substrate. Such method comprises the step of providing a passivated III-V semiconductor substrate (e.g. a substrate comprising a III-V compound, said substrate being passivated), comprising a III-V semiconductor surface (e.g. a surface comprising a III-V compound or made of a III-V compound). This III-V semiconductor surface may be substantially free of native oxidation of the III-V semiconductor material, e.g. may be free of native oxidation of the III-V semiconductor material. The III-V semiconductor surface further has a surface passivation layer provided thereon for preventing oxidation of the III-V semiconductor surface. This surface passivation layer comprises a self-assembled monolayer material obtainable by the reaction on this surface of an organic compound of formula R-A, wherein A is selected from SH, SeH, TeH and Si X$_3$, wherein X is selected from H, Cl, O—CH$_3$, O—C$_2$H$_5$, and O—C$_3$H$_7$, and wherein R is a hydrocarbyl, fluorocarbyl or hydrofluorocarbyl comprising from 5 to 20 carbon atoms. The method also comprises thermally annealing the passivated III-V semiconductor substrate in a substantially non-oxidizing environment, e.g. in a non-oxidizing environment, such as in an inert atmosphere or in a vacuum environment, in order to decompose the self-assembled monolayer material. The method also comprises depositing a layer on the III-V semiconductor surface in this non-oxidizing environment.

Referring to FIG. 1, an exemplary method 100 according to embodiments of the present disclosure is illustrated. This method 100 for depositing a layer on a III-V semiconductor substrate may in particular be a method 100 for depositing a dielectric layer on a III-V semiconductor substrate, the III-V semiconductor substrate comprising a III-V compound. However, the method 100 may also be applied for depositing a conductive layer on the III-V semiconductor substrate, or in general, may be applied for depositing any type of layer for which a clean interface between the substrate and the layer material is desirable. It is an advantage of a method according to embodiments of the present disclosure that a good contact can be achieved between the layer and the semiconductor material, e.g. without interface impurities relating to uncontrolled oxidation of the III-V semiconductor material, e.g. oxidation by exposure to ambient atmospheric conditions, such as exposure to air at 290 K and 1 kPa.

The method 100 comprises the step of providing 102 a passivated III-V semiconductor substrate, e.g. a substrate comprising one or more III-V compounds or being composed of one or more III-V compounds. For example, the method may comprise providing a passivated III-V semiconductor substrate which comprises GaAs, InAs, AlAs, InP and/or InGaAs semiconductor material, e.g. the substrate may be composed of GaAs, InAs, AlAs, InP or InGaAs. In embodiments, a planar passivated III-V semiconductor substrate may be provided, e.g. a planar wafer. In different embodiments, an elongate passivated III-V semiconductor substrate may be provided, e.g. a wire-like element comprising a III-V semiconductor compound. In yet other embodiments, the III-V semiconductor substrate may have an arbitrary geometry, e.g. a geometry predetermined by the requirements of the intended application.

The passivated III-V semiconductor substrate being provided in a method 100 according to embodiments of the present disclosure comprises a III-V semiconductor surface which may be substantially free of native oxidation of the III-V semiconductor material, e.g. may be free of native oxidation of the III-V semiconductor material, for example by being cleaned of oxides of the III-V semiconductor material, e.g. cleaned of oxides of the III-V compound which may have formed under exposure to air. The III-V semiconductor surface furthermore has a surface passivation layer provided thereon for reducing oxidation of the III-V semiconductor surface, e.g. for preventing oxidation of the III-V semiconductor surface. This surface passivation layer comprises a self-assembled monolayer (SAM) material obtainable by the reaction on the III-V semiconductor surface of an organic compound of formula R-A, in which A is selected from SH, SeH, TeH and $SiX_3$, wherein X is selected from H, Cl, O—$CH_3$, O—$C_2H_5$, and O—$C_3H_7$, and wherein R is a hydrocarbyl, fluorocarbyl or hydrofluorocarbyl comprising from 5 to 20 carbon atoms. R may preferably comprise from 8 to 20 carbon atoms, e.g. from 10 to 20 carbon atoms. R may comprise preferably at least 11 carbon atoms, and in a preferred embodiment, R may comprise 18 carbon atoms.

For example, the surface passivation layer may comprise a SAM layer material obtained or obtainable by the chemical reaction of a thiol, a silanol, a selenol and/or a tellurol with the III-V semiconductor material. Organic compound of formula R—$SiX_3$ (silanes) can only physisorb on oxide free surfaces. They are therefore less preferred because they show a lower thermal stability and packing density. The surface passivation layer in accordance with embodiments of the present disclosure may be considered a sacrificial layer, e.g. a sacrificial self-assembled monolayer. Therefore, the passivated III-V semiconductor substrate may be provided with a passivated clean surface, which advantageously is stable in air, e.g. which may substantially prevent oxidation of the III-V compound material when exposed to air for longer than 2 minutes, e.g. for several hours, or even for several days.

In a preferred embodiment of the present disclosure, providing 102 the passivated III-V semiconductor substrate may comprise providing a passivated III-V semiconductor substrate in which the self-assembled monolayer material is obtainable by the reaction on the III-V semiconductor surface of an organic compound of formula HS—R, e.g. a thiol, in which R may be a hydrocarbyl, fluorocarbyl or hydrofluorocarbyl, and in which R may comprise from 5 to 20 carbon atoms, e.g. from 8 to 20 carbon atoms. For example, in a preferred embodiment, R may comprise 11 carbon atoms, or, in an even more preferred embodiment, R may comprise 18 carbon atoms. Furthermore, R may form a linear chain in particular preferred embodiments, or R may form a branched chain, although this is less preferred.

Furthermore, in particular embodiments of the present disclosure, the surface passivation layer may cover the III-V semiconductor surface over substantially the entire area thereof, while in other embodiments, the surface passivation layer may be applied selectively onto the III-V semiconductor surface, e.g. in accordance with a semiconductor device design pattern. In addition, in particular embodiments of the present disclosure, the surface passivation layer can be applied on patterned features. This is performed easily due to the typical nanometric thickness of the passivation layer.

Providing 102 the III-V semiconductor substrate may comprise obtaining 103 the III-V semiconductor substrate, removing 104 oxides eventually present on the III-V semiconductor surface, e.g. removing native oxides of the III-V semiconductor material from the III-V semiconductor surface, and forming 105 the surface passivation layer on the III-V semiconductor surface.

Forming 105 the surface passivation layer may comprise exposing the III-V semiconductor substrate to a fluid which comprises an organic compound of formula R-A, wherein A is selected from S, Se, Te and $SiX_3$, wherein X is selected from H, Cl, O—$CH_3$, O—$C_2H_5$ and O—$C_3H_7$, and wherein R is a hydrocarbyl, fluorocarbyl or hydrofluorocarbyl comprising from 5 to 20 carbon atoms.

Removing 104 of the native oxidation may comprise performing a wet cleaning process step or a dry cleaning process step, e.g. the surface of the III-V semiconductor is cleaned by either a wet or dry cleaning step, which removes the native oxide. An example of wet cleaning process step is an acid etch, e.g. with HCl. Another example is a basic etch, e.g; with $NH_4OH$. An example of dry cleaning process step is a plasma mediated cleaning process such as $Cl_2$, $CCl_4$, $SiCl_4$, $BCl_3$, and $CCl_2F_2$ dry plasmas. Another example of dry cleaning process is an annealing in $H_2$ under 300° C. (e.g. at 250° C.) and under 1 mbar.

In particularly advantageous embodiments, providing 102 the III-V semiconductor substrate may comprise simultaneously performing a SAM formation 105 and a surface cleaning 104.

Forming 105 the surface passivation layer may comprise deposition of a SAM stock material, e.g. a silanol or a thiol, from an anhydrous alcohol solution, an aqueous alcohol solution or an aqueous solution. For a thiol, an anhydrous alcohol solution can typically be used. Forming 105 the surface passivation layer may comprise performing an anhydrous liquid phase deposition. Removing 104 of the oxide may comprise performing a wet cleaning process step simultaneously with the step of forming the self-assembled monolayer on the III-V semiconductor surface.

Alternatively, removing 104 the oxide may comprise performing a dry cleaning process step simultaneously with the step of forming the self-assembled monolayer on the III-V semiconductor surface. For example, in this last case, forming 105 the surface passivation layer may comprise performing a vapour phase deposition of the self-assembled monolayer. For this purpose, the III-V semiconductor surface may be exposed to a vapour of the self-assembled monolayer in a vacuum. In practice, the substrate may be placed in a typical Ultra High Vacuum chamber having a port for attaching a valve. The chamber preferably allows for the cleaning of the surface by e.g. ion sputtering and annealing. The self-assembled monolayer precursor molecules, present in a small container, can be dosed through the valve attached to the port of the chamber. Instead of ultra high vacuum, a non-oxidative atmosphere such as a nitrogen stream can be used.

For molecules with a low vapor pressure the container can be heated moderately.

The advantages of gas phase deposition in a UHV chamber are the possibility of in-situ cleaning and clean environment and the availability of a large number of in situ analytical surface science tools.

In embodiments of the present disclosure, in which removing 104 of the native oxides is effected by a wet cleaning step, performing the wet cleaning process step may comprise immersing the III-V semiconductor substrate in a liquid comprising a cleaning agent and a thiol (which may also be referred to as a mercaptane), a silanol, a selenol and/or a tellurol stock material for advantageously removing the oxide layer and simultaneously forming the self-assembled monolayer on the III-V semiconductor surface, e.g. to achieve SAM formation concomitant with performing the cleaning step.

In embodiments of the present disclosure, in which removing 104 of the native oxides is effected by a dry cleaning step, an exposure of the substrate surface to a cleaning gas, e.g. HCl or phosphides, and the SAM molecules (e.g. via vapour phase deposition) for forming 105 the surface passivation layer may be performed in situ, e.g. simultaneously or sequentially without any intermediate air exposure in order to prevent re-oxidation of the cleaned surface before formation of the surface passivation layer.

It is an advantage of embodiments of the present disclosure that after providing 102 the III-V semiconductor substrate having the surface passivation layer provided thereon, the III-V semiconductor substrate sample can be exposed to air without any decline of the surface properties, e.g. after removing 104 the native oxide from the III-V semiconductor surface and forming 105 the surface passivation layer thereon, the III-V semiconductor substrate sample can be exposed to air without any decline of the surface properties for a time interval of for instance a few hours.

The method 100 may further comprise introducing 106 the passivated III-V semiconductor substrate in a substantially non-oxidizing environment, e.g. in a non-oxidizing environment. This substantially non-oxidizing environment may be an inert gas environment and/or a low-pressure environment, e.g. a vacuum environment. In advantageous embodiments of the present disclosure, this substantially non-oxidizing environment may be provided in a deposition tool, e.g. a chamber for atomic layer deposition (ALD), suitable for performing the step of depositing 108 a layer on the III-V semiconductor surface in the non-oxidizing environment.

This advantageously allows the transfer of the provided passivated substrate while exposed to air before introducing 106 the passivated III-V semiconductor substrate in the substantially non-oxidizing environment, e.g. introduction of the substrate into a tool for depositing a gate dielectric. Thus, the passivated substrate may be stored and/or transported in an oxidizing environment, e.g. exposed to air.

The method 100 also comprises thermally annealing 107 the passivated III-V semiconductor substrate in the non-oxidizing environment such as to decompose the self-assembled monolayer material. Thus, the SAM material is advantageously removed, e.g. in order to fulfill capacitance requirements of a gate stack for which a dielectric layer is deposited on the clean substrate.

Thermally annealing 107 the passivated III-V semiconductor substrate may comprise exposing the III-V semiconductor substrate to a temperature of 470 K or higher, which for example may be suitable for decomposing a thiol-based SAM passivating layer. In general, a suitable temperature range may be determined, e.g. by routine experimentation, such that the SAM material is removed without leaving any detrimental residue on the surface. However, it may be noted that non-detrimental residue can remain on the surface. For example for thiol-based SAM materials, the removal process may crack carbon-sulphur bonds in the SAM layer, and may thus leave sulphur residue on the surface. Surprisingly, this sulphur residue may even be beneficial for the interface properties when depositing a gate dielectric layer thereon. Without being bound by theory, the gate dielectric layer can bond to the S atoms on the surface and thus not to the III-V atoms. Therefore, the interaction between the dielectric and the III-V substrate is less, permitting in some embodiments to have less interface defects. Typically Ga—S bonds do not produce interface states. Experimentally, it has been observed that S-passivated surfaces have lower surface state densities than unpassivated surfaces.

In particularly advantageous embodiments, thermally annealing 107 the III-V semiconductor substrate may furthermore comprise exposing 109 the passivated III-V semiconductor substrate to water for removing residue material which is formed by decomposing of the self-assembled monolayer material. For example, the method may comprise exposing 109 the passivated III-V semiconductor substrate to water vapour for removing residue material which is formed by decomposing of the self-assembled monolayer material. Furthermore, such $H_2O$ exposure may promote the termination of free radicals formed by cracking the SAM material by thermal annealing.

The method 100 further comprises depositing 108 a layer on the passivated III-V semiconductor surface in the non-oxidizing environment.

Depositing 108 the layer on the III-V semiconductor substrate may comprise performing an atomic layer deposition step. Therefore, the annealing step may be followed by an in situ deposition step, e.g. of a gate dielectric, for example without an intermediate air break. Particularly for depositing a gate dielectric layer, this depositing may be preferably performed by ALD, which may lead to good gate dielectrics on III-V semiconductors. However, in other embodiments, an alternative deposition method may be applied, such as molecular beam deposition.

Depositing 108 the layer on the III-V semiconductor substrate may comprise depositing a dielectric material layer comprising a material having a static relative permittivity κ higher than silicon-dioxide, e.g. a material having a static relative permittivity of 4.0 or higher. Thus, the dielectric material layer may comprise a high-κ dielectric. For example, an oxide layer suitable for forming a gate thereon, e.g. a field-effect transistor (FET) gate, may be deposited on the substrate. For example, a layer comprising $Al_2O_3$, $MgO_2$, $ZrO_2$ or $Ln_2O_3$ (Ln=Y, Tm, Yb) dielectric material may be deposited.

In a further aspect, the present disclosure also relates to the use of a method according to the first aspect of the present disclosure for the manufacture of a field effect transistor. For example, the present disclosure also relates to a method for manufacturing a field effect transistor, in which this method comprises depositing a layer, e.g. a gate dielectric layer, on a III-V semiconductor substrate in accordance with an embodiment of the first aspect of the present disclosure. The present disclosure also relates to the use of a method according to the first aspect of the present disclosure for the manufacture of a photovoltaic cell. For example, the present disclosure also relates to a method for manufacturing a photovoltaic cell, in which this method comprises depositing a layer, e.g. a dielectric layer, on a III-V semiconductor substrate in accordance with an embodiment of the first aspect of the present disclosure.

In a yet further aspect, the present disclosure also relates to a III-V semiconductor component comprising a III-V semiconductor substrate having a layer deposited thereon, e.g. having a dielectric material layer deposited thereon, in which an interface region between the III-V semiconductor is substantially free of native oxides of the III-V semiconductor material. The interface region between the III-V semiconductor substrate and the dielectric material furthermore comprises residual sulphur, selenium, tellurium, and/or silicon atoms. For example, the interface region may comprise residual sulphur, selenium, silicon and/or tellurium atoms produced by thermal decomposition of a self-assembled monolayer material obtainable by the reaction on said III-V semiconductor surface of an organic compound of formula R-A, wherein A is selected from SH, SeH, TeH and $SiX_3$, wherein X is selected from H, Cl, O—$CH_3$, O—$C_2H_5$, and O—$C_3H_7$, and wherein R is a hydrocarbyl, fluorocarbyl or hydrofluorocarbyl comprising from 5 to 20 carbon atoms.

The present disclosure also relates to the use of a surface passivation layer provided on a III-V semiconductor surface as a sacrificial layer for preventing oxidation of an intermediate product in the manufacturing process of a III-V semiconductor component, in which the surface passivation layer comprises a self-assembled monolayer material obtainable by the reaction on the III-V semiconductor surface of an organic compound of formula R-A, wherein A is selected from SH, SeH, TeH and $SiX_3$, wherein X is selected from H, Cl, O—$CH_3$, O—$C_2H_5$, and O—$C_3H_7$, and wherein R is a hydrocarbyl, fluorocarbyl or hydrofluorocarbyl comprising from 5 to 20 carbon atoms.

In embodiments according to the present disclosure, the passivated III-V semiconductor substrate may for example comprise an indium arsenide InAs(100) substrate. The surface passivation layer provided thereon may for example comprise a self-assembled monolayer of octadecanethiol. For example, InAs wafers with a (100) crystal orientation, e.g. available from MTI Corporation (Richmond, Calif.), a dry solution of HCl in isopropanol (5-6 N), e.g. available from Acros, and octadecanethiol (ODT), e.g. available from Sigma-Aldrich, may be obtained. Solvents may be deaerated by purging with nitrogen and dried using molecular sieves (type 3A). Removal of the native oxide and subsequent SAM formation may be done in a nitrogen flushed glovebox ($H_2O$<1 ppm). A solution of HCl in isopropanol (3 M) may be prepared by dilution. The InAs sample may be immersed in this solution for 1 min and rinsed twice with isopropanol. Then, the sample may be annealed by placing it on a hot plate at 300° C. for 10 min. The oxide-free InAs sample may be immersed in a 1 mM solution of ODT in ethanol, and reaction may be allowed to proceed, e.g. for at least 24 h. Then, it may be rinsed with ethanol and isopropanol and dried at 60° C. for 30 min.

As another example, an analogue surface passivation can be provided on a GaAs wafer.

As yet another example, the surface cleaning and the surface passivation can be performed simultaneously as follow. An InAs sample may be contacted to a solution of ODT (14 mg, 0.05 mmol) in anhydrous 2 M ethanolic $NH_3$ (5 ml). The sample may then be heated in said solution within a sealed vessel for 12 h at 100° C. before to be allowed to reach room temperature. The samples can then be removed and rinsed successively with ethanol, hexanes, and $CH_2Cl_2$, and then dried under $N_2$.

Figure 2:
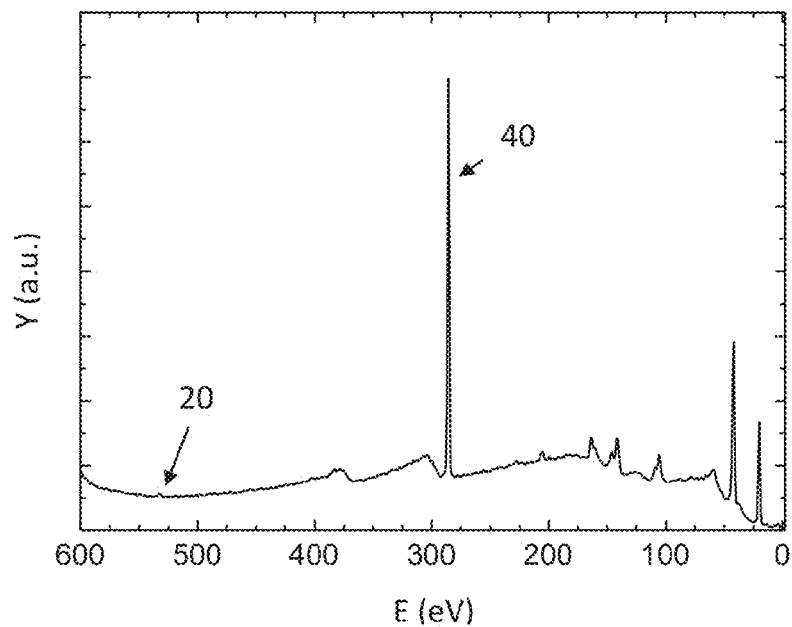
FIG. 2 shows results of X-ray photoelectron spectroscopy (XPS) surface chemical analysis of a passivated III-V semiconductor substrate according to embodiments of the present disclosure.
Figure 3:
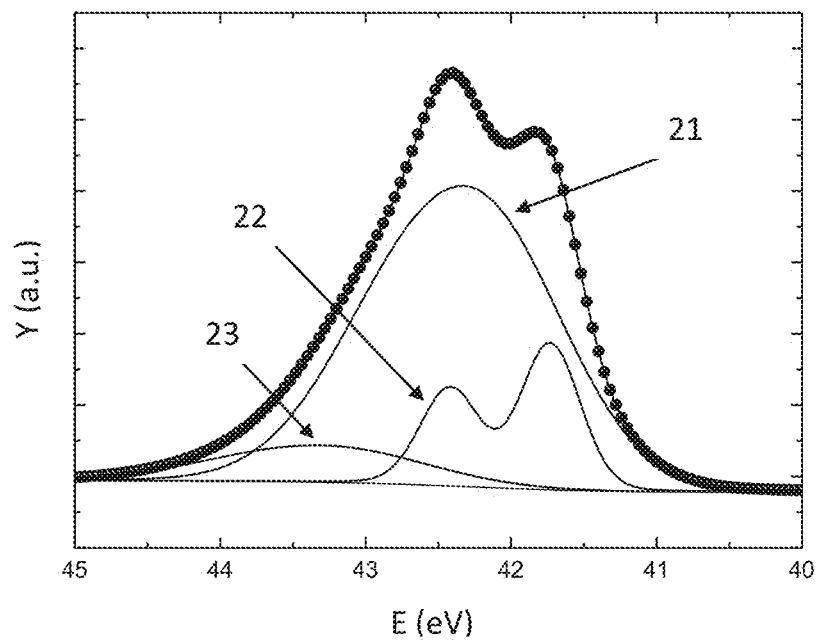
FIG. 3 shows a detailed XPS survey of the As 3d peak of a passivated GaAs substrate according to embodiments of the present disclosure.
Figure 4:
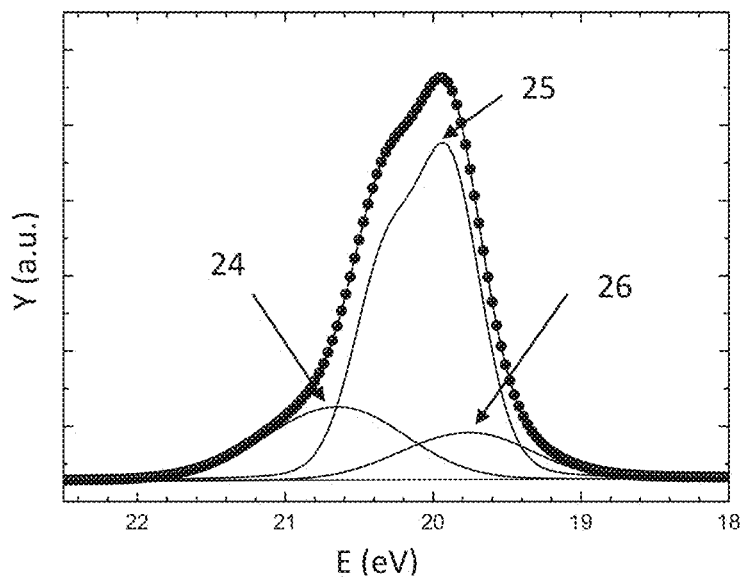
FIG. 4 shows a detailed XPS survey of the Ga 3d peak of a passivated GaAs substrate according to embodiments of the present disclosure.

In the following example, the advantageous properties of a thiol-based passivation layer on a GaAs substrate in accordance with embodiments of the present disclosure will be discussed. In FIG. 2, results of X-ray photoelectron spectroscopy (XPS) surface chemical analysis are shown. The photoelectron yield Y, in arbitrary units a.u., in function of binding energy E, in eV, is shown for a octadecane thiol-based SAM passivated GaAs substrate. No substantial influence of oxygen bonds can be distinguished at 640 eV in the O 1s region 20. FIG. 3 and FIG. 4 show detail surveys of respectively the As 3d peak and the Ga 3d peak. Also shown are fitted mixture models to illustrate the constituent components in these peaks. While no $As^{3+}$ component can be distinguished, a metallic $As^0$ component 21 is clearly present. Furthermore, the As—Ga curve 22 and a small additional component 23, which may correspond to As—C and/or to an As suboxide, can be observed. In FIG. 4, the shoulder in the Ga 3d peak may be attributed to a Ga—S component 24. Also a Ga—As component 25 and a $Ga^0$ component 26 can be observed. Furthermore, in the vertical binding energy (VBE) analysis shown in FIG. 5, a clean, unpinned surface can be observed, e.g. close to a flat band.

The contact angle (not shown) of the SAM/GaAs structure was stable for more than 1 week in air.

Figure 6:
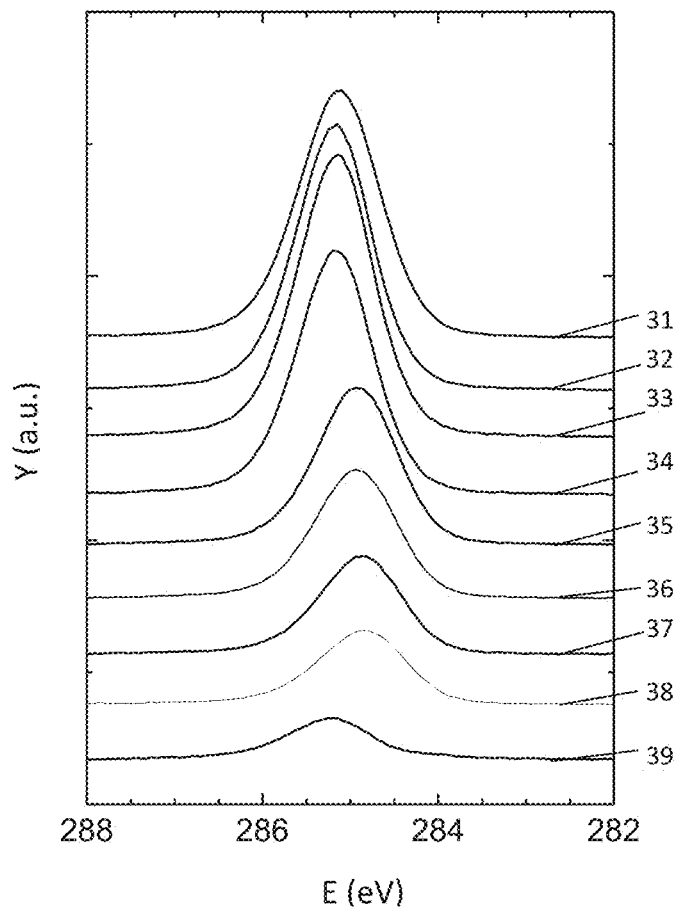
FIG. 6 illustrates the effect of a thermal annealing step in accordance with embodiments of the present disclosure on the C-1s XPS peak.

FIG. 6 illustrates the effect of a thermal annealing step in accordance with embodiments of the present disclosure. The C 1s XPS peak at 640 eV is shown for the substrate before annealing in plot 31, and after annealing at 90° C., 120° C., 150° C., 180° C., 210° C., 250° C. and 300° C. in respectively plots 32, 33, 34, 35, 36, 37 and 38. As can be observed, a decrease of about a factor 10 in C intensity can be observed with respect to the unannealed substrate shown in plot 31. A peak shift to lower binding energies can be seen between 150° C. (plot 34) and 180° C. (plot 35), which may be consistent with the breaking of C—S bonds. Furthermore, an additional $H_2O$ vapour pulsing at 300° C. can further reduce the peak intensity, as can be seen in plot 39.

Figure 7:
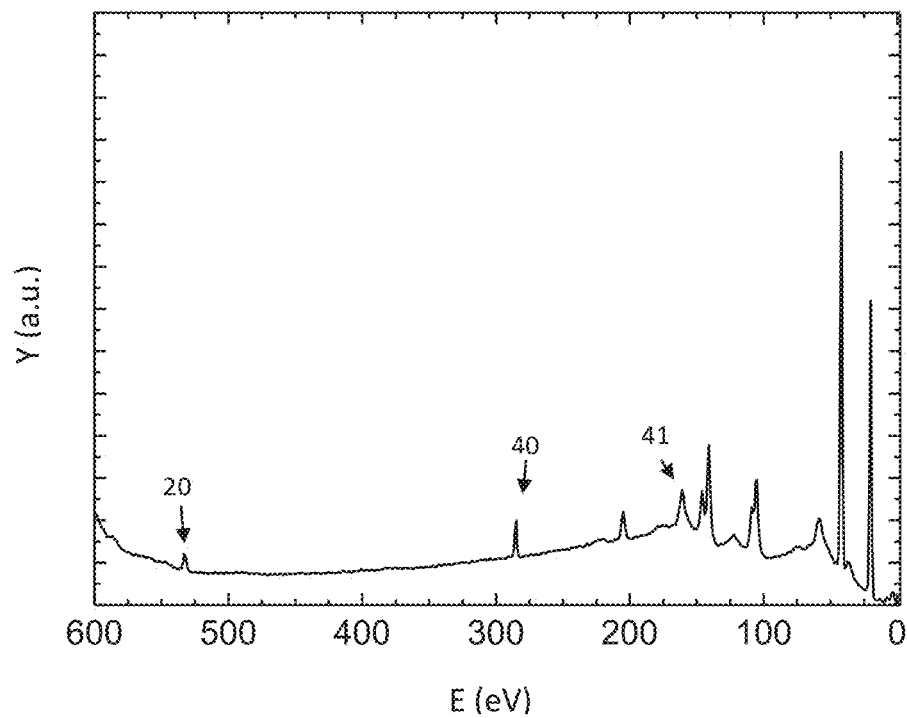
FIG. 7 shows the XPS spectrum of a GaAs surface after annealing at 300° C. with water vapour pulsing in accordance with embodiments of the present disclosure.

The XPS spectrum of a GaAs surface after annealing at 300° C. with water vapour pulsing is shown in FIG. 7. The strong C peak 40 clearly visible in FIG. 2 has been strongly reduced by the annealing and $H_2O$ pulsing. However, sulphur remains present, see peak 41 at about 165 eV, while only a small contribution of oxygen, see peak 20, can be observed.

Figure 8:
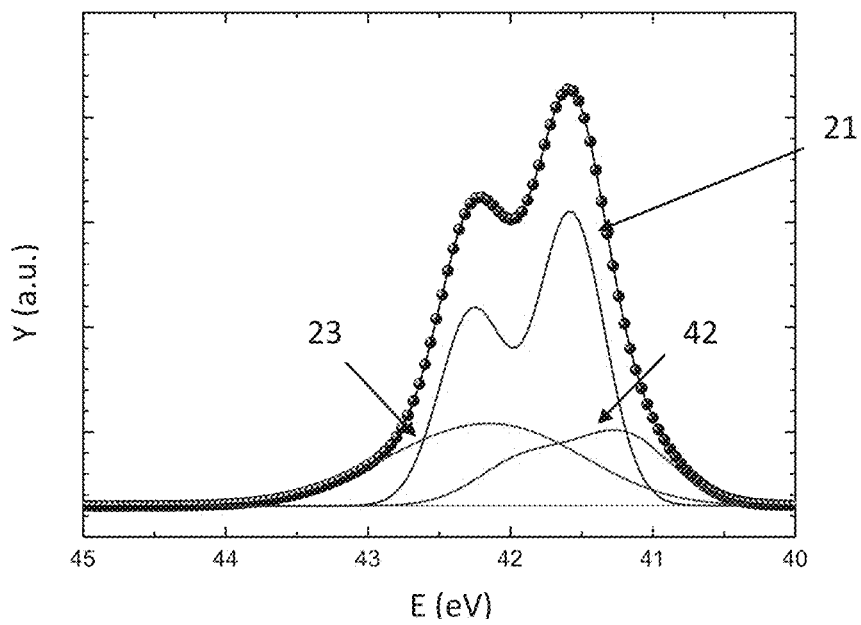
FIG. 8 shows a detailed XPS survey of the As 3d peak of a GaAs substrate after annealing at 300° C. with water vapour pulsing according to embodiments of the present disclosure.
Figure 9:
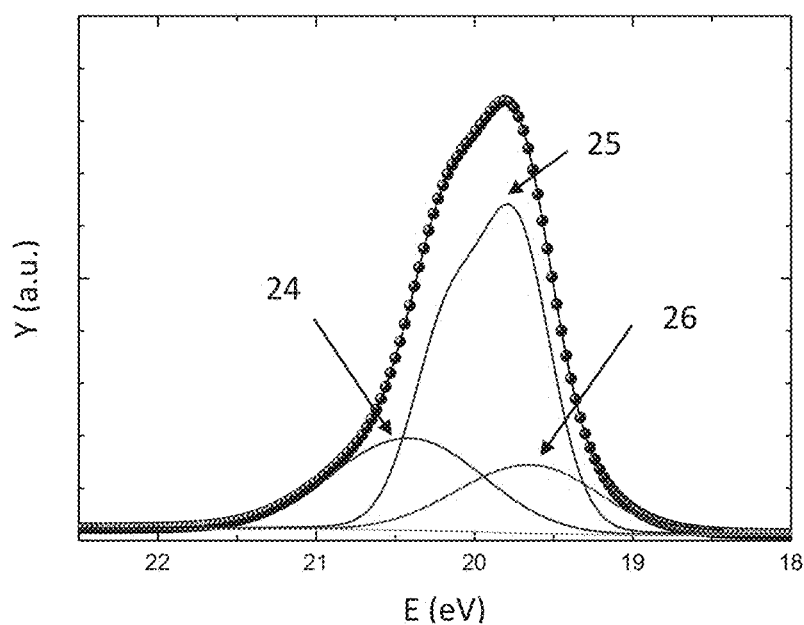
FIG. 9 shows a detailed XPS survey of the Ga 3d peak of a GaAs substrate after annealing at 300° C. with water vapour pulsing according to embodiments of the present disclosure.

FIG. 8 and FIG. 9 show detailed surveys for the annealed substrate of respectively the As 3d peak at 250 eV and the Ga 3d peak at 250 eV, comparable to FIG. 3 and FIG. 4. No $As^{3+}$ appears to be present on the surface. Furthermore, one can observe that the metallic $As^0$ peak 23 is strongly reduced compared to FIG. 3. A surface component 42 can also be distinguished.

Figure 5:
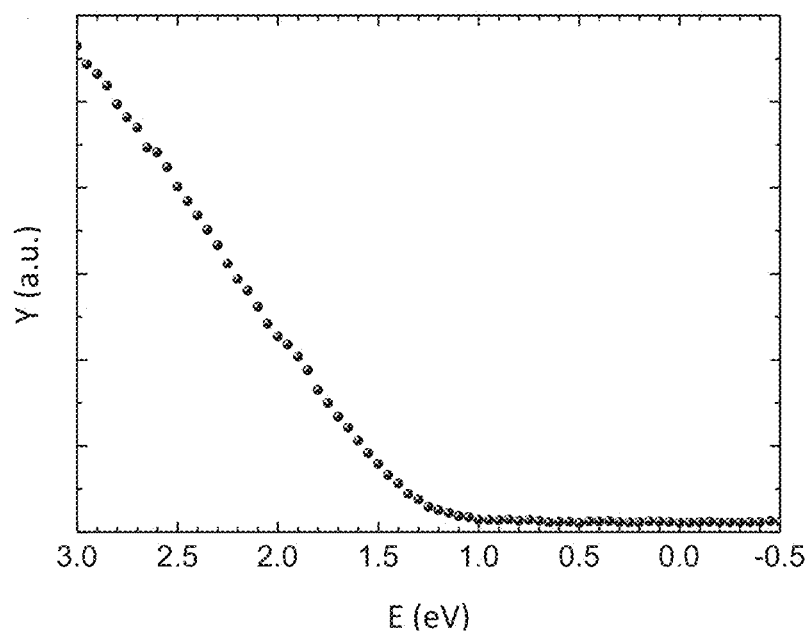
FIG. 5 shows a vertical binding energy (VBE) analysis of a passivated III-V semiconductor substrate according to embodiments of the present disclosure.
Figure 10:
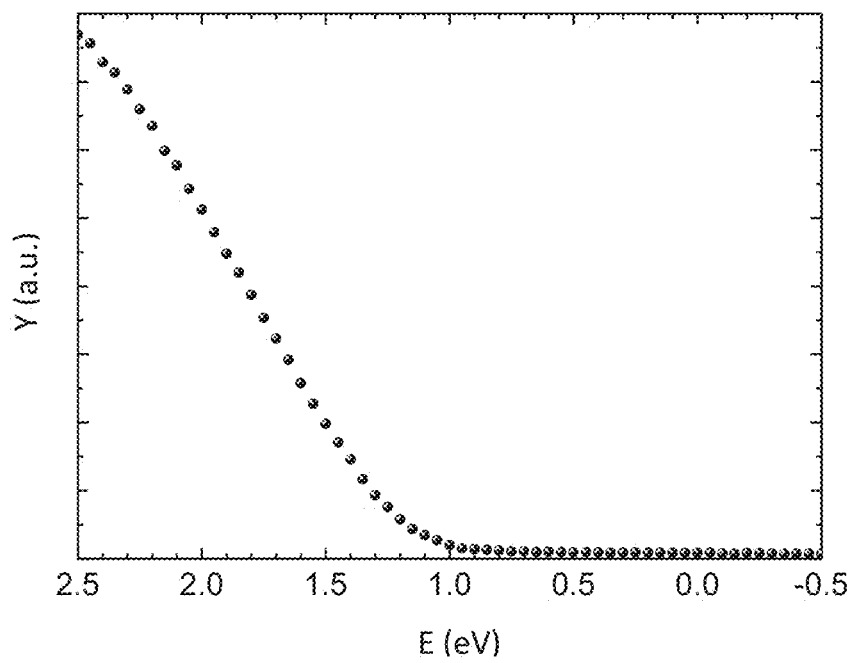
FIG. 10 shows a vertical binding energy (VBE) analysis of a III-V semiconductor substrate after annealing at 300° C. with water vapour pulsing according to embodiments of the present disclosure.

The vertical binding energy (VBE) plot shown in FIG. 10 confirms that an unpinned surface is maintained after annealing, and no substantial shift in the Fermi level can be observed when compared to the unannealed surface results shown in FIG. 5.

Figure 11:
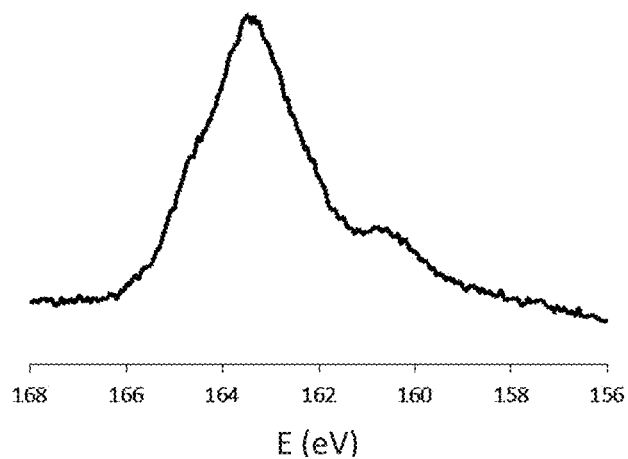
FIG. 11 shows the S 2p XPS spectra of a passivated semiconductor substrate according to embodiments of the present disclosure.
Figure 12:
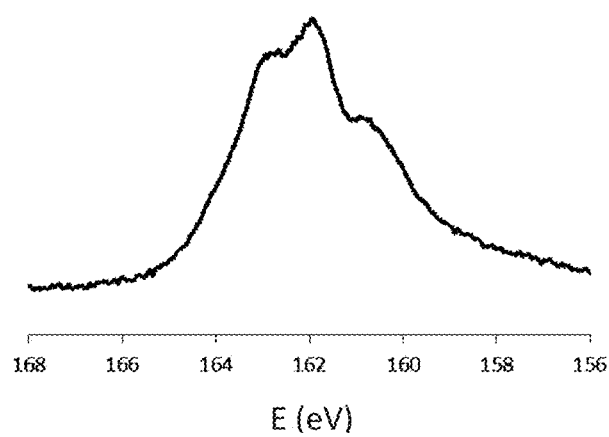
FIG. 12 shows the S 2p XPS spectra of a semiconductor substrate after a SAM removal annealing at 300° C. according to embodiments of the present disclosure.
Figure 13:
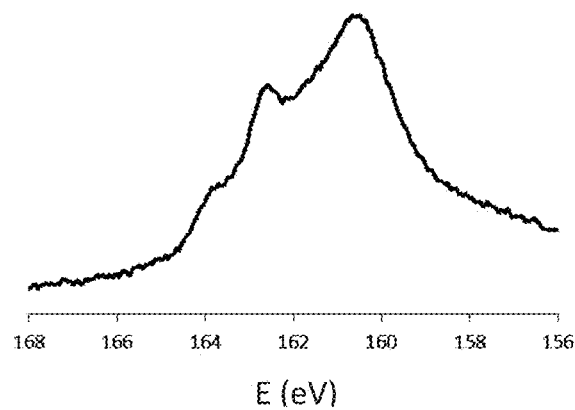
FIG. 13 shows the S 2p XPS spectra of a semiconductor substrate after a SAM removal annealing at 300° C. involving water pulsing according to embodiments of the present disclosure.
Figure 14:
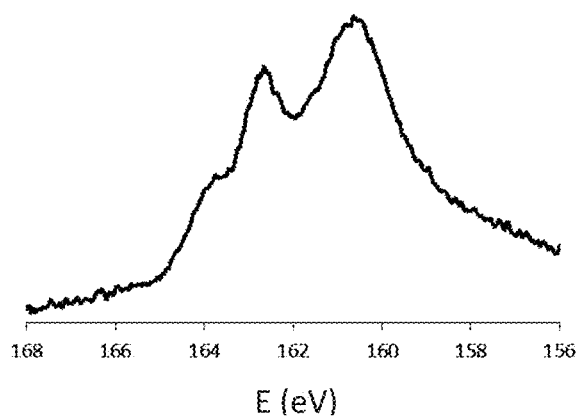
FIG. 14 shows the S 2p XPS spectra of a semiconductor substrate after trimethylaluminium (TMA) deposition according to embodiments of the present disclosure.
Figure 15:
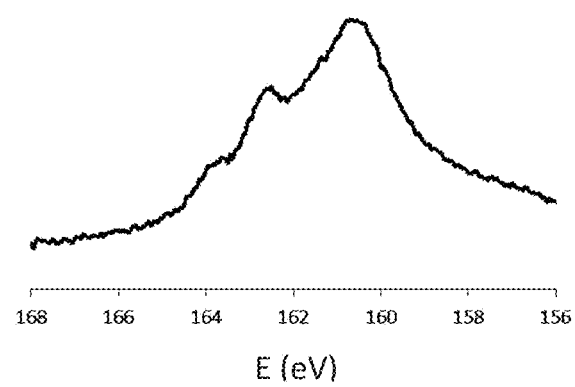
FIG. 15 shows the S 2p XPS spectra of a semiconductor substrate after three cycles of H$_2$O pulsing and TMA deposition according to embodiments of the present disclosure.

FIG. 11 to FIG. 15 show the S 2p XPS spectra at 163 eV. The presence of the overlapping Ga 3 s peak at about 160 eV complicates a detailed analysis and quantification of small contributions to the S 2p peak. However, clear changes can be observed during different stages of the processing. FIG. 11 shows the spectrum of the unannealed substrate, FIG. 12 shows the result after a SAM removal annealing at 300° C., FIG. 13 shows the spectrum after additional $H_2O$ pulsing, FIG. 14 after trimethylaluminium (TMA) deposition and FIG. 15 shows the spectrum after three atomic layer deposition cycles comprising TMA pulses an $H_2O$ pulses.

In conclusion of this example, the results here presented show that in situ removal of a sacrificial SAM layer in accordance with embodiments of the present disclosure may produce a very clean III-V semiconductor surface, in which the properties of the interface region are well-preserved after application of atomic layer deposition (ALD). Furthermore, good quality unpinned n+ GaAs surfaces can be achieved by a method according to embodiments of the disclosure. Application of a method according to embodiments on p-GaAs may furthermore lead to a weakly inverted surface.

The invention claimed is:

1. A method for depositing a layer on a III-V semiconductor substrate, the method comprising:
   (a) providing a passivated III-V semiconductor substrate comprising a III-V semiconductor surface having a surface passivation layer provided thereon for preventing oxidation of said III-V semiconductor surface, said surface passivation layer comprising a self-assembled monolayer material produced by a reaction on said III-V semiconductor surface of an organic compound of formula R-A, wherein A is selected from SH, SeH, TeH and $SiX_3$, wherein X is selected from H, Cl, O—$CH_3$, O—$C_2H_5$, and O—$C_3H_7$, and wherein R is a hydrocarbyl, fluorocarbyl or hydrofluorocarbyl comprising from 5 to 20 carbon atoms;
   (b) thermally annealing said passivated III-V semiconductor substrate in a non-oxidizing environment so as to decompose said self-assembled monolayer material; and
   (c) depositing a layer on said III-V semiconductor surface in said non-oxidizing environment.

2. The method according to claim 1, wherein step (a) self-assembled monolayer material is a reaction product of said surface of an organic compound with formula R—SH.

3. The method according to claim 1, wherein step (c) layer is an atomic layer.

4. The method according to claim 1, wherein step (c) layer is a dielectric material layer comprising a material having a static relative permittivity κ higher than silicon-dioxide.

5. The method according to claim 1, wherein step (b) further comprises exposing said passivated III-V semiconductor substrate to a temperature of 470 K or higher.

6. The method according to claim 1, wherein step (b) further comprises exposing said passivated III-V semiconductor substrate to water.

7. The method according to claim 1, wherein step (a) surface passivation layer is produced by (i) removing oxides present on said III-V semiconductor surface and (ii) forming said surface passivation layer on said III-V semiconductor surface.

8. The method according to claim 7, wherein said forming said surface passivation layer comprises exposing said III-V semiconductor substrate to a fluid comprising an organic compound of formula R-A, wherein A is selected from SH, SeH, TeH and Si $X_3$, wherein X is selected from H, Cl, O—$CH_3$, O—$C_2H_5$, and O—$C_3H_7$, and wherein R is a hydrocarbyl, fluorocarbyl or hydrofluorocarbyl comprising from 5 to 20 carbon atoms.

9. The method according to claim 8, wherein said oxide removal comprises performing a wet cleaning process step and wherein steps (i) and (ii) are performed simultaneously.

10. The method according to claim 8, wherein step (i) comprises performing a dry cleaning process step and wherein steps (i) and (ii) are performed simultaneously.

11. The method according to claim 1, wherein step (a) passivated III-V semiconductor substrate comprises GaAs, InAs, AlAs, InP and/or InGaAs semiconductor material.

12. The method according to claim 1, wherein step (a) passivated III-V semiconductor substrate comprises a planar passivated III-V semiconductor substrate.

13. A method for depositing a layer on a III-V semiconductor substrate, said method comprising:
   (a) thermally annealing a passivated III-V semiconductor substrate in a non-oxidizing environment so as to decompose a self-assembled monolayer material present on said passivated III-V semiconductor substrate, said passivated III-V semiconductor substrate comprising a III-V semiconductor surface having a surface passivation layer provided thereon for preventing oxidation of said III-V semiconductor surface, said surface passivation layer comprising said self-assembled monolayer material produced by the reaction on said III-V semiconductor surface of an organic compound of formula R-A, wherein A is selected from SH, SeH, TeH and $SiX_3$, wherein X is selected from H, Cl, O—$CH_3$, O—$C_2H_5$, and O—$C_3H_7$, and wherein R is a hydrocarbyl, fluorocarbyl or hydrofluorocarbyl comprising from 5 to 20 carbon atoms; and
   (b) depositing a layer on said III-V semiconductor surface in said non-oxidizing environment.

* * * * *